United States Patent
Tseng et al.

(10) Patent No.: US 12,266,852 B2
(45) Date of Patent: Apr. 1, 2025

(54) ELECTRONIC DEVICE

(71) Applicant: InnoLux Corporation, Miao-Li County (TW)

(72) Inventors: Chia-Ping Tseng, Miao-Li County (TW); Ker-Yih Kao, Miao-Li County (TW); Chia-Chi Ho, Miao-Li County (TW); Ming-Yen Weng, Miao-Li County (TW); Hung-I Tseng, Miao-Li County (TW); Shu-Ling Wu, Miao-Li County (TW); Huei-Ying Chen, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 9 days.

(21) Appl. No.: 18/401,885

(22) Filed: Jan. 2, 2024

(65) Prior Publication Data

US 2024/0162602 A1    May 16, 2024

Related U.S. Application Data

(63) Continuation of application No. 17/929,907, filed on Sep. 6, 2022, now Pat. No. 11,901,618, which is a
(Continued)

(30) Foreign Application Priority Data

Sep. 9, 2019   (CN) .......................... 201910848956.X (51) Int. Cl.
*H01Q 1/38* (2006.01)
*G02F 1/1343* (2006.01)
(Continued)

(52) U.S. Cl.
CPC ........... *H01Q 1/38* (2013.01); *G02F 1/13439* (2013.01); *H01L 21/045* (2013.01);
(Continued)

(58) Field of Classification Search
CPC ........... G02F 1/13439; G02F 1/133345; G02F 2201/07; H01L 21/045; H01L 27/1237; H01Q 3/34; H01Q 3/44; H01Q 9/0407
(Continued)

(56) References Cited

U.S. PATENT DOCUMENTS

| 6,256,076 B1 * | 7/2001 | Bae .................... G02F 1/136213 349/39 |
| 2013/0153872 A1 * | 6/2013 | Lai .................... H01L 21/32134 438/669 |
| 2018/0061869 A1 * | 3/2018 | Suzuki .............. G02F 1/134309 |

* cited by examiner

*Primary Examiner* — Michael H Caley
*Assistant Examiner* — William D Peterson
(74) *Attorney, Agent, or Firm* — McClure, Qualey & Rodack, LLP (57) ABSTRACT

An electronic device is provided. The electronic device includes a first substrate, an insulating layer, a first conductive layer and a second conductive layer. The insulating layer is overlapped with the first substrate. The second conductive layer contacts with the first conductive layer. The first conductive layer and the second conductive layer are disposed between the first substrate and the insulating layer. The second conductive layer is disposed between the first conductive layer and the insulating layer. Moreover, a thermal expansion coefficient of the second conductive layer is between a thermal expansion coefficient of the first conductive layer and a thermal expansion coefficient of the insulating layer.

13 Claims, 8 Drawing Sheets

Related U.S. Application Data continuation of application No. 16/732,701, filed on Jan. 2, 2020, now Pat. No. 11,469,491.

(60) Provisional application No. 62/799,120, filed on Jan. 31, 2019.

(51) Int. Cl.
*H01L 21/04* (2006.01)
*H01L 27/12* (2006.01)
*H01Q 3/34* (2006.01)
*H01Q 3/44* (2006.01)
*H01Q 9/04* (2006.01)
*G02F 1/1333* (2006.01)

(52) U.S. Cl.
CPC ............ *H01L 27/1237* (2013.01); *H01Q 3/34* (2013.01); *H01Q 3/44* (2013.01); *H01Q 9/0407* (2013.01); *G02F 1/133345* (2013.01); *G02F 2201/07* (2013.01)

(58) Field of Classification Search
USPC ........................................................ 347/771
See application file for complete search history.

ELECTRONIC DEVICE

CROSS REFERENCE TO RELATED APPLICATIONS

This application is a Continuation of U.S. patent application Ser. No. 17/929,907, filed Sep. 6, 2022, now U.S. Pat. No. 11,901,618, which claims priority of U.S. patent application Ser. No. 16/732,701, filed Jan. 2, 2020, now U.S. Pat. No. 11,469,491, which claims priority of U.S. Provisional Patent Application No. 62/799,120 filed on Jan. 31, 2019, and Chinese Patent Application 201910848956.X, filed on Sep. 9, 2019 the entirety of which are incorporated by reference herein.

BACKGROUND

Technical Field

The present disclosure relates to an electronic device and an antenna device, and in particular it relates to an electronic device and antenna device with multiple electrode layers.

Description of the Related Art

Electronic products such as smartphones, tablets, notebooks, displays, TVs, and other portable electronic products have become indispensable necessities in modern society. With the flourishing development of such portable electronic products, consumers have high expectations regarding the quality, functionality, or price of such products. Such electronic products can generally be used as electronic modulation devices as well, for example, as antenna devices that can modulate electromagnetic waves.

Although currently existing antenna devices have been adequate for their intended purposes, they have not been satisfactory in all respects. For example, due to the difference in coefficient of thermal expansion (CTE) between the metal electrode and the passivation layer of the antenna device, microcracks form easily in the passivation layer, which may lead to corrosion of the metal electrode.

Therefore, the development of a structural design that can effectively improve the stability or operational reliability of electronic devices is still one of the goals that the industry currently aims for.

SUMMARY

In accordance with some embodiments of the present disclosure, an electronic device is provided. The electronic device includes a first substrate, an insulating layer, a first conductive layer and a second conductive layer. The insulating layer is overlapped with the first substrate. The second conductive layer contacts with the first conductive layer. The first conductive layer and the second conductive layer are disposed between the first substrate and the insulating layer. The second conductive layer is disposed between the first conductive layer and the insulating layer. Moreover, a thermal expansion coefficient of the second conductive layer is between a thermal expansion coefficient of the first conductive layer and a thermal expansion coefficient of the insulating layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The structure of the antenna device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be understood that the drawings are not drawn to scale. In fact, the size of the elements may be arbitrarily enlarged or reduced in order to clearly present the features of the present disclosure In addition, the expressions "a first material layer is disposed on or over a second material layer" may indicate that the first material layer is in direct contact with the second material layer, or that the first material layer is not in direct contact with the second material layer, there being one or more intermediate layers disposed between the first material layer and the second material layer.

Furthermore, the elements or devices in the drawings of the present disclosure may be present in any form or configuration known to those with ordinary skill in the art. It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

The phrase "in a range from a first value to a second value" or "in a range between a first value and a second value" indicates that the range includes the first value, the second value, and other values between them.

In some embodiments of the present disclosure, terms concerning attachments, coupling and the like, such as "connected", "interconnected" and "contact", refer to a relationship wherein structures are secured or attached to one another either directly or indirectly through intervening structures, as well as both movable or rigid attachments or relationships, unless expressly described otherwise.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Figure 1:
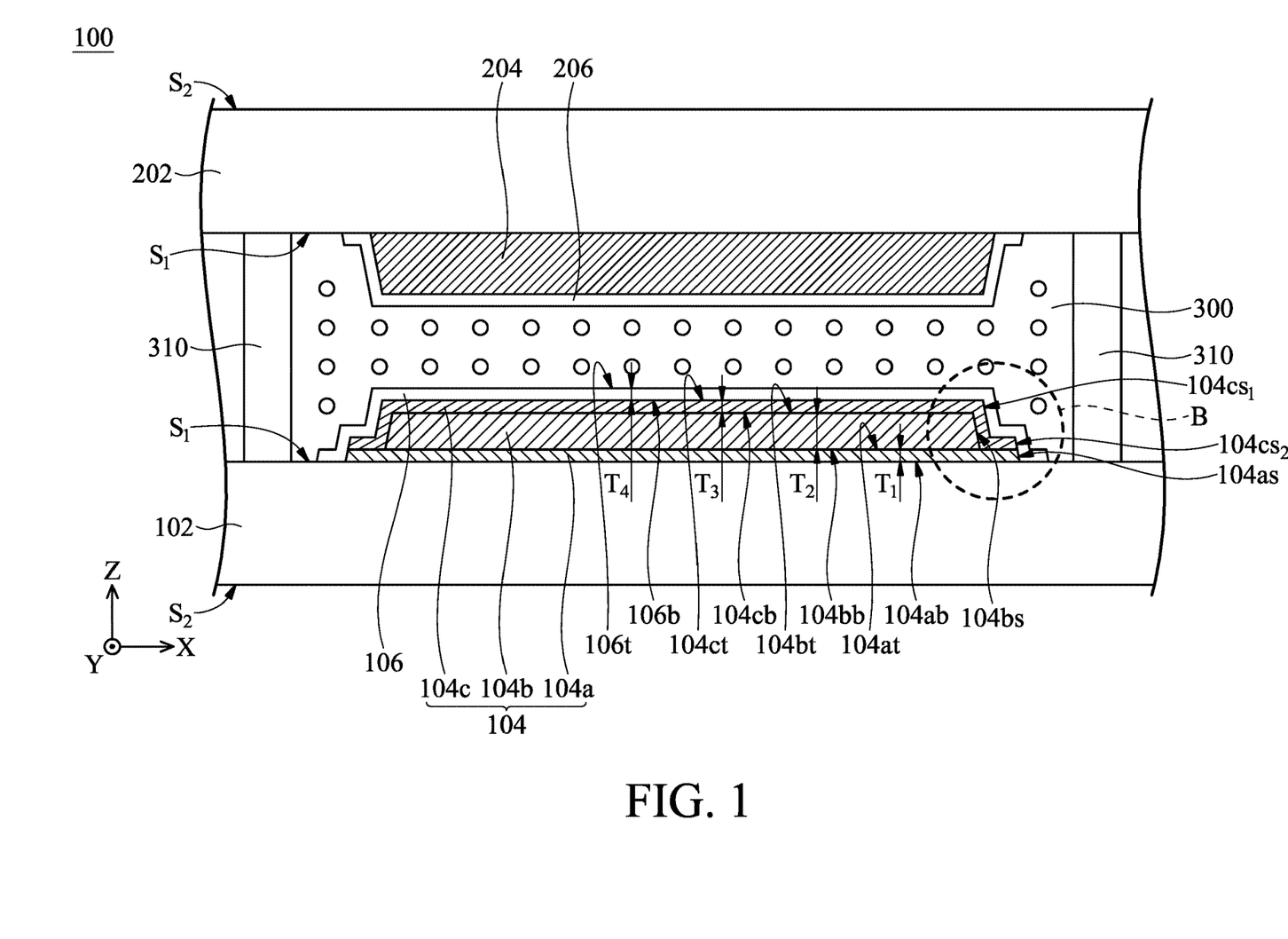
FIG. 1 is a cross-sectional diagram of the electronic device in accordance with some embodiments of the present disclosure.

Refer to FIG. 1, which is a cross-sectional diagram of an electronic device 100 in accordance with some embodiments of the present disclosure. It should be understood that in accordance with some embodiments, additional features may be added to the electronic device 100 described below. In accordance with some other embodiments, some features of the electronic device 100 described below may be replaced or omitted.

As shown in FIG. 1, the electronic device 100 may include a first substrate 102 and a second substrate 202, and the second substrate 202 may be disposed opposite the first substrate 102. Specifically, the first substrate 102 may have a first surface $S_1$ and a second surface $S_2$, and the first surface $S_1$ and the second surface $S_2$ may be located on opposite sides. Similarly, the second substrate 202 may have a first surface $S_1$ and a second surface $S_2$ that are located on opposite sides. In some embodiments, the first surface $S_1$ of the first substrate 102 may be adjacent to the first surface $S_1$ of the second substrate 202 and may be disposed opposite each other.

In some embodiments, the first substrate 102 and the second substrate 202 may be a flexible substrate, a rigid substrate, or a combination thereof. In some embodiments, the first substrate 102 and the second substrate 202 may include, but are not limited to, a glass substrate, a sapphire substrate, a ceramic substrate, a plastic substrate, a liquid-crystal polymer (LCP) substrate, other suitable substrate materials, or a combination thereof. In some embodiments, the material of the plastic substrate may include, but is not limited to, polyimine (PI), polyethylene terephthalate (PET), polycarbonate (PC), polyether oxime (PES), polybutylene terephthalate (PBT), polynaphthalene ethylene glycolate (PEN), polyarylate (PAR), other suitable materials, or a combination thereof. Moreover, in some embodiments, the material of the first substrate 102 may be the same as or different from the material of the second substrate 202.

In addition, as shown in FIG. 1, the electronic device 100 may include a multilayer electrode 104, and the multilayer electrode 104 may be disposed on the first substrate 102. Specifically, the multilayer electrode 104 may be disposed on the first surface $S_1$ of the first substrate 102. In accordance with some embodiments, the multilayer electrode 104 may include a first conductive layer 104a, a second conductive layer 104b, and a third conductive layer 104c. The second conductive layer 104b may be disposed on the first conductive layer 104a, and the third conductive layer 104c may be disposed on the second conductive layer 104b. In some embodiments, the first conductive layer 104a may be in contact with the first substrate 102.

It should be noted that due to the difference in thermal expansion coefficients between the second conductive layer 104b and the first passivation layer 16, and the poor adhesion between the second conductive layer 104b and the first passivation layer 16, when the temperature changes, the structure of the first passivation layer 16 formed on the second conductive layer 104b may be easily affected or damaged. For example, cracks may easily form at the corner of the first passivation layer 106. As a result, the moisture that is generated or the chemical solvent that is used in subsequent processes can easily penetrate into the second conductive layer 104b through the microcracks, thereby causing corrosion or oxidation of the second conductive layer 104b.

However, in accordance with some embodiments of the present disclosure, the provided electronic device 100 includes a multilayer electrode 104 having a first conductive layer 104a, a second conductive layer 104b, and a third conductive layer 104c. The third conductive layer 104c may serve as a buffer layer that entirely covers the second conductive layer 104b to protect the second conductive layer 104b. The third conductive layer 104c may be used to improve the above issues, for example, the difference in adhesion abilities or thermal expansion coefficients between the passivation layer and the multilayer electrode. Therefore, the risk of microcracks forming in the passivation layer and corrosion of the multilayer electrode may be reduced.

It should be understood that although the multilayer electrode 104 has a three-layer structure in the embodiments illustrated in the drawings, the present disclosure is not limited thereto. The multilayer electrode 104 may have another suitable number of layers in accordance with various embodiments.

Specifically, in accordance with some embodiments of the present disclosure, adhesion ability may be measured by the Cross-Cut method (ASTM D3359, ISO/DIN 2409 standard specification). According to the results of the Cross-Cut test, the sample that conforms to the standard of ASTM grade 5B indicates good adhesion ability. Furthermore, in some embodiments, the thermal expansion coefficient of the material of the third conductive layer 104c may be between the thermal expansion coefficient of the second conductive layer 104b and the thermal expansion coefficient of the first passivation layer 106 ($10^{-6}$/K @20° C.). For example, the thermal expansion coefficient of the material of the third conductive layer 104c may be from 2 to 17, or from 4 to 15, such as 5, 6, 7, 8, 9, 10, 11, 12, 13, 14 and so on.

In addition, as shown in FIG. 1, in accordance with some embodiments, the second conductive layer 104b may be entirely covered by the third conductive layer 104c. The term "entirely" means that both a top surface 104bt and a side surface 104bs of the second conductive layer 104b are completely covered. Specifically, in some embodiments, the bottom surface 104bb of the second conductive layer 104b may be in contact with the first conductive layer 104a, and the top surface 104bt and the side surface 104bs of the second conductive layer 104b may be in contact with the third conductive layer 104c. In other words, in some embodiments, the third conductive layer 104c may entirely cover the top surface 104bt and the side surface 104bs of the second conductive layer 104b. In some embodiments, the third conductive layer 104c may also cover a portion of a top surface 104at of the first conductive layer 104a. In some embodiments, the third conductive layer 104c may also cover a portion of a side surface 104as of the first conductive layer 104a.

In some embodiments, the material of the first conductive layer 104a may include, but is not limited to, titanium (Ti), molybdenum (Mo), titanium alloy, molybdenum alloy, indium zinc oxide (IZO), indium tin oxide (ITO), other suitable materials, or a combination thereof. In some embodiments, the first conductive layer 104a may include material selected from a group consisting of titanium, molybdenum, indium zinc oxide, and indium tin oxide. For example, in some embodiments, the material of the first conductive layer 104a may include, but is not limited to, molybdenum-titanium alloy (MoTi), molybdenum-tantalum alloy (MoTa), molybdenum-niobium alloy (MoNb), or a combination thereof.

In some embodiments, the material of the second conductive layer 104b may include, but is not limited to, copper (Cu), aluminum (Al), copper alloy, aluminum alloy, other suitable materials, or a combination thereof. In some embodiments, the second conductive layer 104b may include material selected from a group consisting of copper and aluminum. In some embodiments, the material of the second conductive layer 104b may be the same as the material of the gate, source or drain of the thin-film transistor that is used to control of the multilayer electrode 104 or the electrode 204.

In some embodiments, the material of the third conductive layer 104c may include, but is not limited to, titanium (Ti), molybdenum (Mo), titanium alloy, molybdenum alloy, indium zinc oxide (IZO), indium tin oxide (ITO), other suitable materials, or a combination thereof. In some embodiments, the third conductive layer 104c may include material selected from a group consisting of titanium, molybdenum, indium zinc oxide, and indium tin oxide. For example, in some embodiments, the material of the third conductive layer 104c may include, but is not limited to, molybdenum-titanium alloy (MoTi), molybdenum-tantalum alloy (MoTa), molybdenum-niobium alloy (MoNb), or a combination thereof.

In addition, the first conductive layer 104a may have a first thickness $T_1$. In some embodiments, the first thickness $T_1$ of the first conductive layer 104a may be in a range from nm to 200 nm (i.e. 5 nm≤the first thickness $T_1$≤200 nm), from 5 nm to 100 nm, or from nm to 40 nm, for example, 15 nm, 20 nm, 25 nm, 30 nm, or 35 nm. In accordance with some embodiments, the first thickness $T_1$ refers to the distance between the bottom surface 104ab and the top surface 104at of the first conductive layer 104a in the normal direction of the first substrate 102 (e.g., the Z direction shown in the figure). Specifically, the first thickness $T_1$ may be an average thickness (e.g., 3 to 5 thickness values are measured and then an average value is obtained therefrom) or a maximum thickness of the first conductive layer 104a in the normal direction of the first substrate 102 (e.g., the Z direction). In addition, the first thickness $T_1$ may be measured, for example, by a Scanning Electron Microscope (SEM). In some embodiments where the first substrate 102 has flexibility, the first substrate 102 is first flattened, and then the average thickness or the maximum thickness of the first conductive layer 104a in a cross section is measured along the normal direction of the first substrate 102.

The second conductive layer 104b may have a second thickness $T_2$. In some embodiments, the second thickness $T_2$ of the second conductive layer 104b may be greater than 1 micrometer (μm), for example, may be in a range from 0.5 μm to 10 μm (i.e. 0.5 μm≤the second thickness $T_2$≤10 μm), from 1 μm to 9 μm, or from 3 μm to 8 μm, for example, 4 μm, 5 μm, 6 μm, or 7 μm. In accordance with some embodiments, the second thickness $T_2$ refers to the distance between the bottom surface 104bb and the top surface 104bt of the second conductive layer 104b in the normal direction of the first substrate 102 (e.g., the Z direction shown in the figure). The detailed definition of the second thickness $T_2$ of the second conductive layer 104b is similar to that of the first thickness $T_1$ of the first conductive layer 104a, and thus will not be repeated herein.

In addition, the third conductive layer 104c may have a third thickness $T_3$. In some embodiments, the third thickness $T_3$ of the third conductive layer 104c may be in a range from 10 nanometers (nm) to 200 nanometers (nm) (i.e. 10 nm the third thickness $T_3$≤200 nm), from 10 nm to 100 nm, or from 20 nm to 40 nm, for example, 25 nm, 30 nm, or nm. In accordance with some embodiments, the third thickness $T_3$ refers to the distance between the bottom surface 104cb and the top surface 104ct of the third conductive layer 104c in the normal direction of the first substrate 102 (e.g., the Z direction shown in the figure). The detailed definition of the third thickness $T_3$ of the third conductive layer 104c is similar to that of the first thickness $T_1$ of the first conductive layer 104a, and thus will not be repeated herein.

It should be understood that if the third thickness $T_3$ of the third conductive layer 104c is too small (for example, less than 10 nm), the third conductive layer 104c may be not be able to entirely cover the second conductive layer 104b, or may have a nonuniform thickness due to processing factors. As a result, the effectiveness of protecting the second conductive layer 104b may be reduced. On the contrary, if the third thickness $T_3$ is too large (for example, greater than 100 nm), the manufacturing cost of the third conductive layer 104c may be increased.

Moreover, a detailed aspect of the positional relationship between the first conductive layer 104a, the second conductive layer 104b, and the third conductive layer 104c will be described later.

In addition, in some embodiments, the multilayer electrode 104 may be formed by using one or more deposition processes, photolithography processes, and etching processes. In some embodiments, the deposition process may include, but is not limited to, a chemical vapor deposition process, a physical vapor deposition process, an electroplating process, an electroless plating process, other suitable processes, or a combination thereof. The chemical vapor deposition process may include, for example, a low pressure chemical vapor deposition process (LPCVD), a low temperature chemical vapor deposition process (LTCVD), a rapid temperature chemical vapor deposition process (RTCVD), and a plasma enhanced chemical vapor deposition process (PECVD), or an atomic layer deposition process (ALD) and so on, but it is not limited thereto. The physical vapor deposition process may include, for example, a sputtering process, an evaporation process, a pulsed laser deposition process and so on, but it is not limited thereto. In addition, in some embodiments, the photolithography process may include photoresist coating (e.g., spin coating), soft baking, hard baking, mask alignment, exposure, post-exposure baking, photoresist development, cleaning and drying. In some embodiments, the etching process described above may include a dry etching process, a wet etching process, or other suitable etching processes.

The detailed steps of the method for manufacturing the first conductive layer 104a, the second conductive layer 104b, and the third conductive layer 104c will be described later.

Moreover, as shown in FIG. 1, in some embodiments, the electronic device 100 may further include a first passivation layer 106, and the first passivation layer 106 may be disposed on the multilayer electrode 104. Specifically, in some embodiments, the first passivation layer 106 may be conformally formed on the multilayer electrode 104 of the third conductive layer 104c. For example, the first passivation layer 106 may be disposed along with the thickness variation of the third thickness $T_3$ that is located below the first passivation layer 106. For example, the first passivation layer 106 may be disposed along the top surface 104ct and down to the side surface 104cs of the third conductive layer 104c. In some embodiments, the first passivation layer 106 may be in contact with the top surface 104ct, the side surface 104cs$_1$, and the side surface 104cs$_2$ of the third conductive layer 104c, and the first passivation layer 106 may also be in contact with the side surface 104as of the first conductive layer 104a. In other words, in some embodiments, the first passivation layer 106 may entirely cover the top surface 104ct and the side surface 104cs$_1$ and the side surface 104cs$_2$ of the third conductive layer 104c. Moreover, in some embodiments, the first passivation layer 106 may further extend onto the first surface $S_1$ of the first substrate 102.

In addition, it should be understood that although the second conductive layer 104b illustrated in the figure has a sharp top corner, the second conductive layer 104b may have a curved top corner in accordance with some other embodiments. In the embodiments where the second conductive layer 104b has a curved top corner, the problem of the second conductive layer 104b being peeled off from the subsequently formed layer may be improved.

In some embodiments, the first passivation layer 106 may have a single layer structure or a multilayer structure. In some embodiments, the material of the first passivation layer 106 may include, but is not limited to, an inorganic material, an organic material, or a combination thereof. In some embodiments, the inorganic material may include, but is not limited to, silicon nitride, silicon oxide, silicon oxynitride, other suitable materials, or a combination thereof. In some embodiments, the organic material may include, but is not limited to, polyethylene terephthalate (PET), polyethylene (PE), polyethersulfone (PES), polycarbonate (PC), polymethylmethacrylate (PMMA), polyimide (PI), photo-sensitive polyimide (PSPI), other suitable materials, or a combination thereof.

Furthermore, the first passivation layer 106 may have a fourth thickness $T_4$. In some embodiments, the fourth thickness $T_4$ of the first passivation layer 106 may be in a range from 10 nm to 500 nm (i.e. 10 nm the fourth thickness $T_4 \leq 500$ nm), from 50 nm to 200 nm, or from 80 nm to 150 nm, for example, 90 nm, 100 nm, 110 nm, 120 nm, 130 nm, or 140 nm. In accordance with some embodiments, the fourth thickness $T_4$ refers to distance between the bottom surface 106b and the top surface 106t of the first passivation layer 106 above the multilayer electrode 104 in the normal direction of the first substrate 102 (e.g., the Z direction shown in the figure). The detailed definition of the fourth thickness $T_4$ of the first passivation layer 106 is similar to that of the first thickness $T_1$ of the first conductive layer 104a, and thus will not be repeated herein.

It should be understood that if the fourth thickness T 4 of the first passivation layer 106 is too small (e.g., less than 10 nm), the first passivation layer 106 may be unable to entirely cover the multilayer electrode 104, thereby reducing the effectiveness of protecting the multilayer electrode 104, or the thickness of the first passivation layer 106 may be nonuniform due to processing factors. On the contrary, if the fourth thickness T 4 is too large (for example, greater than 500 nm), the manufacturing cost of the first passivation layer 106 may be increased.

In some embodiments, the first passivation layer 106 may be formed by using a chemical vapor deposition process, a physical vapor deposition process, a coating process, a printing process, other suitable processes, or a combination thereof. Moreover, the first passivation layer 106 may be patterned by one or more photolithography processes and etching processes. In some embodiments, the photolithography process may include photoresist coating (e.g., spin coating), soft baking, hard baking, mask alignment, exposure, post-exposure baking, photoresist development, cleaning, drying and so on. In some embodiments, the etching process described above may include a dry etching process, a wet etching process, or other suitable etching processes.

Still referring to FIG. 1, the electronic device 100 may further include an electrode 204, and the electrode 204 may be disposed on the second substrate 202. Specifically, the electrode 204 may be located between the first substrate 102 and the second substrate 102b and may be disposed on the first surface $S_1$ of the second substrate 102b.

In some embodiments, the multilayer electrode 104 may have an opening (not illustrated), and the opening may overlap the electrode 204 in the normal direction of the first substrate 102 (e.g., the Z direction shown in the figure). In some embodiments, the multilayer electrode 104 may be patterned to have an opening. In some embodiments, the electrode 204 may also be patterned to have multiple regions (only a portion of the electrodes 204 are illustrated in the figure). In some embodiments, the multiple regions of the electrodes 204 may be connected to different circuits.

In some embodiments, the electrode 204 and/or the multilayer electrode 104 may be electrically connected to a functional circuit (not illustrated). The functional circuit may include an active component (e.g., a thin-film transistor) or a passive component (e.g., controlled by an integrated circuit (IC) or microchip). The thin-film transistor may be, for example, a switching transistor, a driving transistor, a reset transistor, or other suitable thin-film transistors. In some embodiments, the aforementioned functional circuit may be located on the first surface $S_1$ of the second substrate 202 (or the first substrate 102) as well as the electrode 204 (or the multilayer electrode 104). In some other embodiments, the functional circuit may be located on the second surface $S_2$ of the second substrate 202 (or the first substrate 102), and the functional circuit may be electrically connected to the electrode 204 (or the multilayer electrode 104). For example, the functional circuit may be electrically connected to the electrode 204 (or the multilayer electrode 104) by vias (not illustrated) that penetrate through the second substrate 202 (or the first substrate 102), flexible circuit boards, or other suitable electrical connection methods, but it is not limited thereto.

In some embodiments, the electrode 204 may include a conductive material, such as a metal conductive material, a transparent conductive material, or a combination thereof. In some embodiments, the metal conductive material may include, but is not limited to, copper (Cu), aluminum (Al), molybdenum (Mo), silver (Ag), tin (Sn), tungsten (W), gold (Au), chromium (Cr), nickel (Ni), platinum (Pt), copper alloy, aluminum alloy, molybdenum alloy, silver alloy, tin alloy, tungsten alloy, gold alloy, chromium alloy, nickel alloy, platinum alloy, other suitable metal materials, or a combination thereof. In some embodiments, the transparent conductive material may include a transparent conductive oxide (TCO). For example, the transparent conductive oxide may include, but is not limited to, indium tin oxide (ITO), tin oxide (SnO), zinc oxide (ZnO), indium zinc oxide (IZO), indium gallium zinc oxide (IGZO), indium tin oxide (ITZO), antimony tin oxide (ATO), antimony zinc oxide (AZO), other suitable transparent conductive materials, or a combination thereof.

Moreover, in some embodiments, the electrode 204 may have a single layer structure or a multilayer structure. In accordance with some embodiments, the structure of the electrode 204 may be the same as or similar to the structure of the multilayer electrode 104, but the present disclosure is not limited thereto. Specifically, in some embodiments, the electrode 204 may also include a first conductive layer 104a, a second conductive layer 104b, and a third conductive layer 104c sequentially formed on the first surface $S_1$ of the second substrate 202.

In addition, in some embodiments, the electrode 204 may be formed by using one or more deposition processes, photolithography processes, and etching processes. In some embodiments, the deposition process may include, but is not limited to, a chemical vapor deposition process, a physical vapor deposition process, an electroplating process, an electroless plating process, other suitable processes, or a combination thereof. In some embodiments, the photolithography process may include photoresist coating (e.g., spin coating), soft baking, hard baking, mask alignment, exposure, post-exposure baking, photoresist development, cleaning, drying and so on. In some embodiments, the etching process described above may include a dry etching process, a wet etching process, or other suitable etching processes.

In addition, it should be understood that although only one multilayer electrode 104 and one electrode 204 are illustrated in the figures, the electronic device 100 may include multiple multilayer electrodes 104 and/or electrodes 204 according to need in accordance with some embodiments.

Still referring to FIG. 1, in accordance with some embodiments, the electronic device 100 may further include a second passivation layer 206, and the second passivation layer 206 may be disposed on the electrode 204. Specifically, in some embodiments, the second passivation layer 206 may be conformally formed on the electrode 204. In some embodiments, the second passivation layer 206 may further extend onto the first surface $S_1$ of the second substrate 202.

In some embodiments, the second passivation layer 206 may have a single layer structure or a multilayer structure. In some embodiments, the material of the second passivation layer 206 may include, but is not limited to, an inorganic material, an organic material, or a combination thereof. In some embodiments, the inorganic material may include, but is not limited to, silicon nitride, silicon oxide, silicon oxynitride, other suitable materials, or a combination thereof. In some embodiments, the organic material may include, but is not limited to, polyethylene terephthalate (PET), polyethylene (PE), polyethersulfone (PES), polycarbonate (PC), polymethylmethacrylate (PMMA), polyimide (PI), photosensitive polyimide (PSPI), other suitable materials, or a combination thereof.

In some embodiments, the second passivation layer 206 may be formed by a chemical vapor deposition process, a physical vapor deposition process, a coating process, a printing process, other suitable processes, or a combination thereof. Furthermore, the second passivation layer 206 may be patterned by one or more photolithography processes and etching processes. In some embodiments, the photolithography process may include photoresist coating (e.g., spin coating), soft baking, hard baking, mask alignment, exposure, post-exposure baking, photoresist development, cleaning, drying and so on. In some embodiments, the etching process described above may include a dry etching process, a wet etching process, or other suitable etching processes.

In addition, as shown in FIG. 1, the electronic device 100 may further include a working medium 300. The working medium 300 may be disposed between the first substrate 102 and the second substrate 202, and a portion of the working medium 300 may be located between the multilayer electrode 104 and the electrode 204. In accordance with some embodiments, a material having different properties (e.g., dielectric constants) that can be adjusted by application of an electric field or other means may be used as the working medium 300. In some embodiments, the capacitance may be adjusted by applying different electric fields to the working medium 300 so that the direction of transmission of the electromagnetic signals through the opening (not illustrated) may be controlled.

In some embodiments, the working medium 300 may include, but is not limited to, a liquid-crystal layer. In some embodiments, the material of the liquid-crystal layer may include a nematic liquid-crystal, a smectic liquid-crystal, a cholesteric liquid-crystal, a blue-phase liquid-crystal, other suitable liquid-crystal materials, or a combination thereof. Specifically, in some embodiments, the aforementioned functional circuit may apply a voltage to the electrode 204, and the properties of the working medium 300 between the multilayer electrode 104 and the electrode 204 may be changed by the electric field generated between the multilayer electrode 104 and the electrode 204. Furthermore, the functional circuit may apply another voltage to the multilayer electrode 104, but it is not limited thereto. In some other embodiments, the multilayer electrode 104 may be electrically floating, grounded, or connected to other functional circuits (not illustrated), but it is not limited thereto.

In addition, in accordance with some embodiments, the electronic device 100 may further include a spacer element 310 disposed between the first substrate 102 and the second substrate 202. The spacer element 310 may support the first substrate 102 and the second substrate 202 to enhance the structural strength of the electronic device 100. In some embodiments, the spacer element 310 may have a ring structure. In some embodiments, the spacer elements 310 may have a columnar structure and may be arranged in parallel with each other.

Moreover, the spacer element 310 may include an insulating material. In some embodiments, the insulating material may include, but is not limited to, polyethylene terephthalate (PET), polyethylene (PE), polyethersulfone (PES), polycarbonate polycarbonate (PC), polymethylmethacrylate (PMMA), glass, or a combination thereof.

Furthermore, in accordance with some embodiments, the electronic device 100 may further include an alignment layer (not illustrated) disposed between the first passivation layer 106 and the working medium 300 and between the second passivation layer 206 and the working medium 300 to control the arrangement direction of the liquid-crystal molecules in the working medium 300. In some embodiments, the material of the alignment layer may include, but is not limited to, an organic material, an inorganic material, or a combination thereof. For example, the organic material may include, but is not limited to, polyimide (PI), a photoreactive polymer material, or a combination thereof. The inorganic material may include, for example, silicon oxide ($SiO_2$), but it is not limited thereto.

In accordance with some embodiments of the present disclosure, the electronic device 100 provided may be a display device, an antenna device, a sensing device, or a tiled device, or other devices for modulating electromagnetic waves, but it is not limited thereto. In accordance with some embodiments, the electronic device 100 may be a bendable or flexible electronic device. In accordance with some embodiments, the electronic device 100 may and other electronic devices together may form a tiled device. In some embodiments, the other electronic devices described above may include a display device (for example, a liquid-crystal display (LCD)), a light-emitting device, a detecting device, or a combination thereof, but they are not limited thereto.

In some embodiments of the present disclosure, the electronic device 100 may also include an organic light-emitting diode (OLED) display device or an inorganic light-emitting diode display device (not illustrated). The organic light-emitting diode may include an upper electrode, a lower electrode, and an organic light-emitting layer formed between the upper electrode and the lower electrode. The inorganic light-emitting diode may include a quantum dot light-emitting diode (Q-LED), a micro LED or a mini LED. The luminescent material of the micro LED or the mini LED may include, but is not limited to, fluorescence, phosphor or any other suitable material or a combination thereof.

In some other embodiments of the present disclosure, the electronic device 100 may be an antenna device, such as a liquid-crystal antenna device, but it is not limited thereto. The electronic device 100 also may be a tiled device, such as a tiled display device or a tiled antenna device, but it is not limited thereto. It should be noted that the electronic device may be any combination of the foregoing, but it is not limited thereto.

Figure 2A:
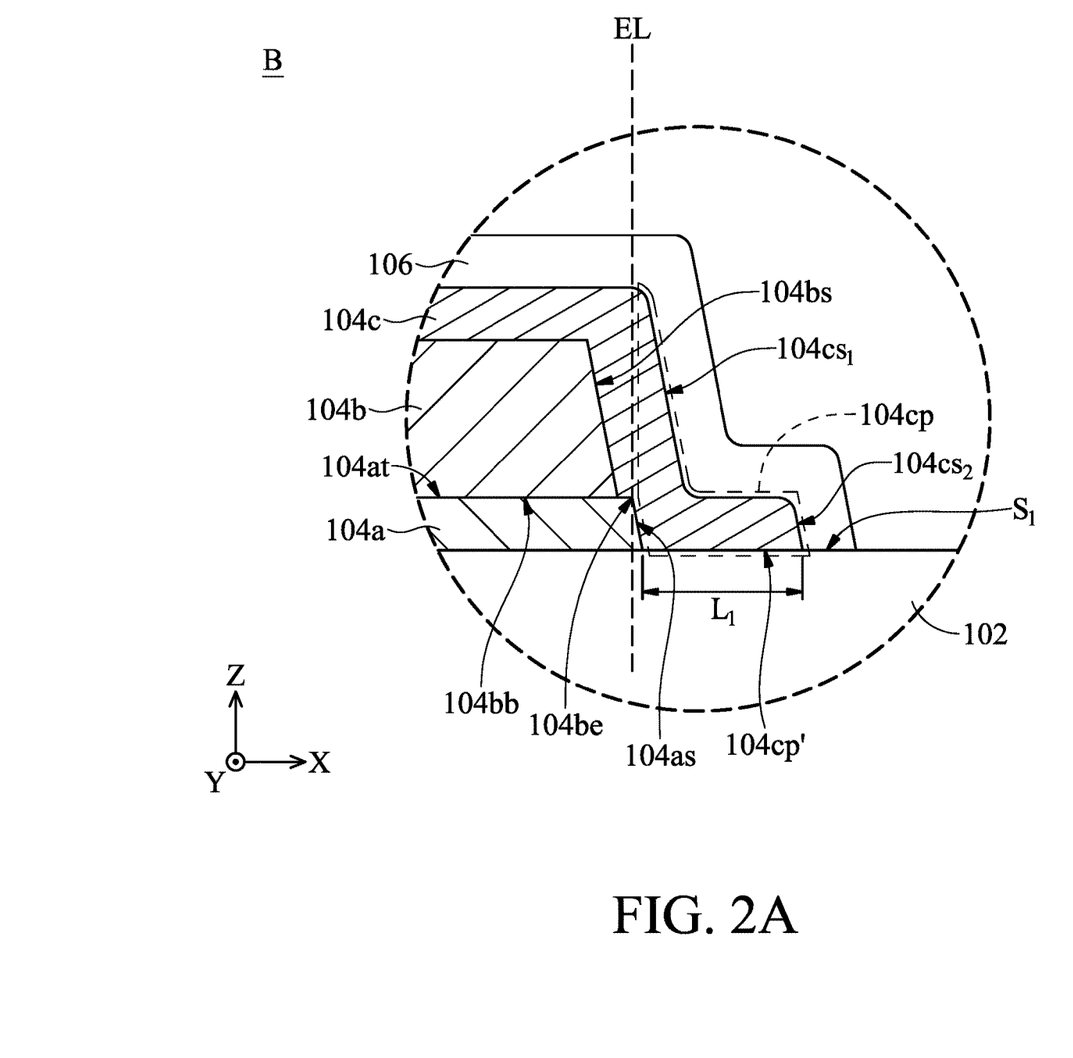
FIGS. 2A-2C are enlarged diagrams of region B shown in FIG. 1 in accordance with some embodiments of the present disclosure.
Figure 2B:
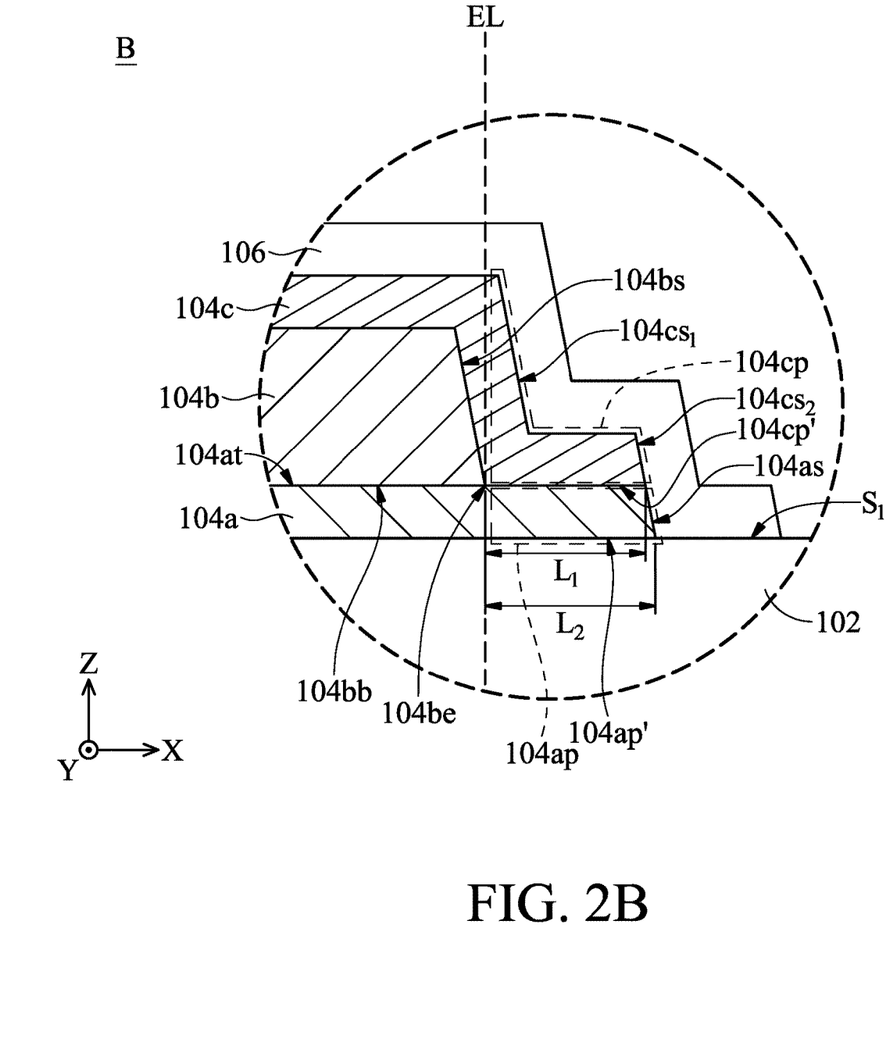
Figure 2C:
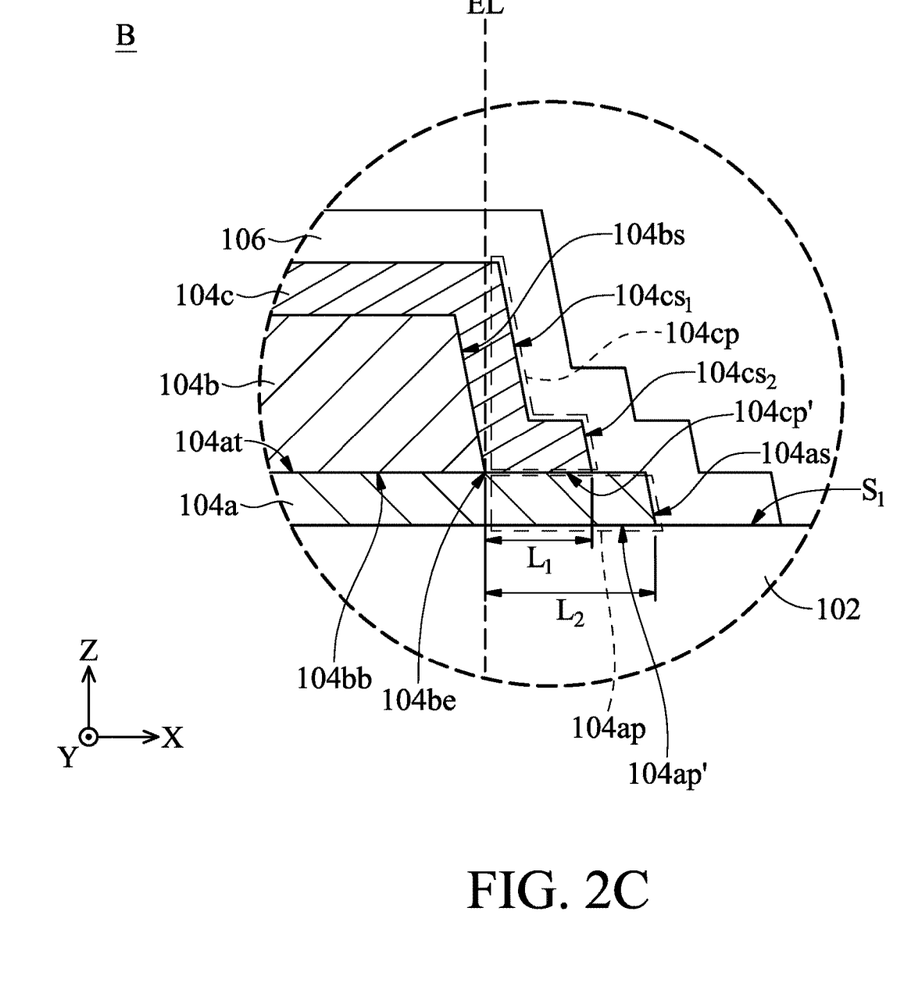

Next, refer to FIGS. 2A to 2C, which are enlarged diagrams of the region B shown in FIG. 1 in accordance with some embodiments of the present disclosure. Furthermore, FIGS. 2A to 2C are diagrams illustrating the embodiments in which the electronic device 100 is an antenna device. However, it should be understood that the structure described below may be applied to other electronic devices in accordance with some other embodiments. Specifically, FIGS. 2A-2C illustrate the arrangement relationship of the first conductive layer 104a, the second conductive layer 104b, the third conductive layer 104c, and the first passivation layer 106 in accordance with some embodiments of the present disclosure. It should be understood that the same or similar components or elements in above and below contexts are represented by the same or similar reference numerals. The materials, manufacturing methods and functions of these components or elements are the same or similar to those described above, and thus will not be repeated herein.

As shown in FIGS. 2A-2C, in accordance with some embodiments of the present disclosure, the third conductive layer 104c may include a first portion 104cp and the first portion 104cp may extend beyond the second conductive layer 104b. As shown in FIG. 2A, in some embodiments, the first portion 104cp of the third conductive layer 104c may cover the first surface $S_1$ of the first substrate 102 and the side surface 104as of the first conductive layer 104a. In some embodiments, the side surface 104bs of the second conductive layer 104b may be not aligned with the side surface 104as of the first conductive layer 104a. In some embodiments, the side surface 104as of the first conductive layer 104a may protrude from the side surface 104bs of the second conductive layer 104b, for example, the side surface 104as may be closer to the first portion 104cp than the side surface 104bs. The bottom surface 104bb of the second conductive layer 104b may have an end point 104be. In accordance with some embodiments, the first portion 104cp of the third conductive layer 104c may be defined by an extension line EL, which is a reference line that passes through the end point 104be and is parallel to the normal direction of the first substrate 102 (e.g., the Z direction as shown in the figure). Specifically, the first portion 104cp of the third conductive layer 104c may be defined as the portion (e.g., as indicated by dashed line in the figure) of the third conductive layer 104c that starts from the extension line EL and extends beyond the extension line EL along the direction parallel to first surface $S_1$ of the first substrate 102 (e.g., the X direction shown in the figure). In other words, the first portion 104cp of the third conductive layer 104c may be the portion surrounded by the side surface $104cs_1$ and the side surface $104cs_2$ of the third conductive layer 104c, and the extension line EL.

Furthermore, the first portion 104cp may have a first length $L_1$. In accordance with some embodiments, the first length $L_1$ refers to the length of the bottom surface 104cp' of the first portion 104cp of the third conductive layer 104c (along a direction parallel to the first surface $S_1$ of the first substrate 102, e.g., along the X direction shown in the figure). In some embodiments, the first length $L_1$ of the first portion 104cp may be greater than 0.1 μm (i.e. the first length $L_1 \geq 0.1$ μm), for example, from 0.1 μm to 4 μm (i.e. 0.1 μm ≤ the first length $L_1 \leq 4$ μm), or from 0.1 μm to 3 μm, such as 0.5 μm, 1 μm, 1.5 μm, 2 μm, or 2.5 μm, but it is not limited thereto.

It should be understood that if the first length $L_1$ of the first portion 104cp is too small (e.g., less than 0.1 μm), the third conductive layer 104c may be not able to entirely cover the second conductive layer 104b, thereby reducing the effectiveness of protecting the second conductive layer 104b. On the contrary, if the first length $L_1$ is too large (e.g., greater than 4 μm), the manufacturing cost of the third conductive layer 104c may be increased.

Referring to FIG. 2B, the difference between FIG. 2B and FIG. 2A is that, in some embodiments, the bottom surface 104cp' of the third conductive layer 104c may overlap the top surface 104at of the first conductive layer 104a in the Z direction. In accordance with some embodiments of the present disclosure, the first conductive layer 104a may include a second portion 104ap, the second portion 104ap may extend beyond the second conductive layer 104b, and may be in contact with the first portion 104cp of the third conductive layer 104c. It should be understood that the second portion 104ap is omitted in the embodiment shown in FIG. 2A for clarity of illustration. As described above, the bottom surface 104bb of the second conductive layer 104b may have the end point 104be. In accordance with some embodiments, the second portion 104ap of the first conductive layer 104a may be defined by the extension line EL, which is the reference line that passes through the end point 104be and is parallel to the normal direction of the first substrate 102 (e.g., the Z direction shown in the figure). Specifically, the second portion 104ap of the first conductive layer 104a may be defined as the portion (e.g., as indicated by dashed line in the figure) of the first conductive layer 104a that starts from the extension line EL and extends beyond the extension line EL along the direction parallel to first surface $S_1$ of the first substrate 102 (e.g., the X direction shown in the figure). In other words, the second portion 104ap of the first conductive layer 104a may be the portion between the side surface 104as of the first conductive layer 104a and the extension line EL.

Furthermore, the second portion 104ap may have a second length $L_2$. In accordance with some embodiments, the second length $L_2$ refers to the length of the bottom surface 104ap' of the second portion 104ap of the first conductive layer 104a (along the direction parallel to the first surface $S_1$ of the first substrate 102, e.g., along the X direction shown in the figure). In some embodiments, the second length $L_2$ of the second portion 104ap may be greater than 0.1 μm (i.e. the second length $L_2 \geq 0.1$ μm), for example, from 0.1 μm to 4 µm (i.e. 0.1 µm≤the second length $L_2$≤4 µm), or from 0.1 µm to 3 µm, such as 0.5 µm, 1 µm, 1.5 µm, 2 µm, or 2.5 µm, but it is not limited thereto.

It should be understood that if the second length $L_2$ of the second portion 104ap is too small (e.g., less than 0.1 µm), the first conductive layer 104a may expose a portion of the second conductive layer 104b, thereby reducing the effectiveness of protecting the second conductive layer 104b. On the contrary, if the second length $L_2$ is too large (e.g., greater than 4 µm), the manufacturing cost of the first conductive layer 104a may be increased.

In addition, as shown in FIG. 2B, in some embodiments, the side surface $104cs_2$ of the third conductive layer 104c may be aligned with the side surface 104as of the first conductive layer 104a. However, as shown in FIG. 2C, the difference between the FIG. 2C and FIG. 2B is that, in some embodiments, the side surface $104cs_2$ of the third conductive layer 104c may not be aligned with the side surface 104as of the first conductive layer 104a. In accordance with some embodiments, "align" means that the surfaces are leveled with each other. Specifically, in some embodiments, the side surface $104cs_2$ of the third conductive layer 104c may shrink inward compared to the side surface 104as of the first conductive layer 104a.

In accordance with the embodiments of the present disclosure, an optical microscopy (OM), a scanning electron microscope (SEM), a film thickness profiler (α-step), an ellipsometer, or other suitable instruments may be used to measure the thickness or the length of the components, or the distance between the components, but it is not limited thereto. Specifically, in some embodiments, after the working medium 300 is removed, a cross-sectional image of the structure may be obtained using a scanning electron microscope, and the thickness or the length of the components, or the distance between the components in the image may be measured.

Next, referring to FIGS. 3A-3F, which are cross-sectional diagrams of some components (for example, a multilayer electrode 104) of the electronic device 100 in the intermediate stages of manufacture in accordance with some embodiments of the present disclosure. It should be understood that additional operations may be provided before, during, and/or after the method for manufacturing the electronic device 100 in accordance with some embodiments. In accordance with some embodiments, some of the operations described below may be replaced or eliminated. In accordance with some embodiments, the order of the operations may be interchangeable.

Figure 3A:
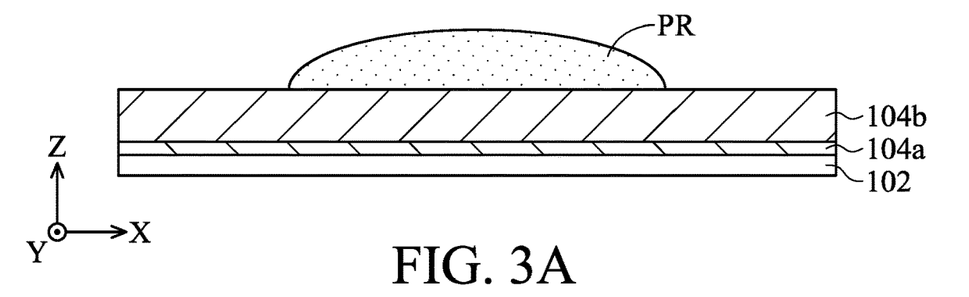
FIGS. 3A-3F are cross-sectional diagrams of the electronic device in the intermediate stages of manufacture in accordance with some embodiments of the present disclosure.

Referring to FIG. 3A, in some embodiments, the first substrate 102 may be provided, and the first conductive layer 104a and the second conductive layer 104b may be sequentially formed on the first substrate 102. Next, a photoresist PR may be formed on the second conductive layer 104b to define a subsequent patterned shape of the second conductive layer 104b.

In some embodiments, the first conductive layer 104a and second conductive layer 104b may be formed by the aforementioned physical vapor deposition process, the aforementioned chemical vapor deposition process, an electroplating process, an electroless plating process, other suitable processes, or a combination thereof. In addition, in some embodiments, the photoresist PR may be patterned by a patterning process. In some embodiments, the patterning process may include a photolithography process and an etching process. The photolithography process may include, but is not limited to, photoresist coating (e.g., spin coating), soft baking, hard baking, mask alignment, exposure, post-exposure baking, photoresist development, cleaning, drying and so on. In some embodiments, the etching process described above may include, but is not limited to, a dry etching process or a wet etching process.

Figure 3B:
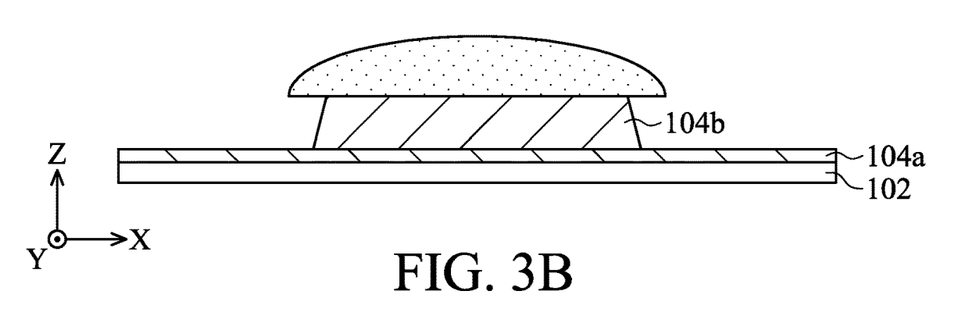

Next, referring to FIG. 3B, in some embodiments, a portion of the second conductive layer 104b may be removed to form the patterned second conductive layer 104b. Specifically, the second conductive layer 104b that is not shielded by the photoresist PR may be removed by an etching process. In this embodiment, the above etching process may be a selective etching process, for example, only a portion of the second conductive layer 104b is removed without removing the first conductive layer 104a. In this embodiment, the above etching process may be a wet etching process. However, in some other embodiments, a portion of the second conductive layer 104b may also be removed by a dry etching process.

Figure 3C:
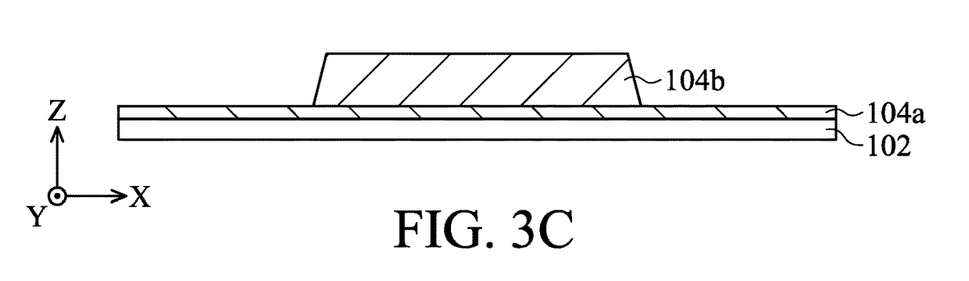

Next, referring to FIG. 3C, in some embodiments, after the patterned second conductive layer 104b is formed, the photoresist PR may be removed. In some embodiments, the photoresist PR may be removed by a wet stripping process, a plasma ashing process, or a combination thereof.

Figure 3D:
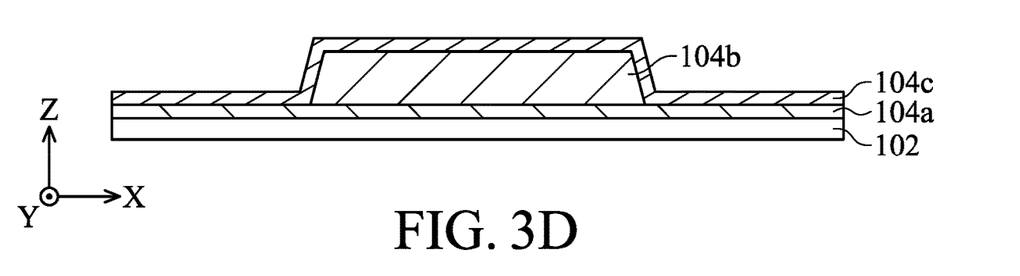

Next, referring to FIG. 3D, in some embodiments, the third conductive layer 104c may be formed on the first substrate 102. In some embodiments, the third conductive layer 104c may be conformally formed on the first conductive layer 104a and the second conductive layer 104b.

In some embodiments, the third conductive layer 104c may be formed by the aforementioned physical vapor deposition process, the aforementioned chemical vapor deposition process, an electroplating process, an electroless plating process, other suitable processes, or a combination thereof.

Figure 3E:
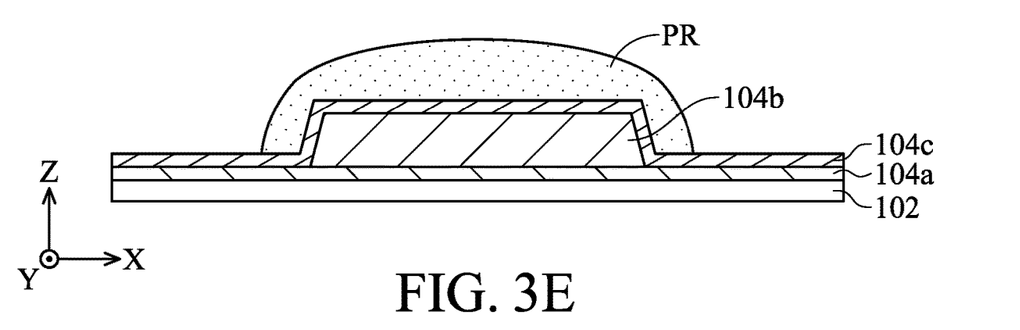

Next, referring to FIG. 3E, in some embodiments, a photoresist PR may be formed on the first substrate 102 to define a subsequent patterned shape of the first conductive layer 104a and the third conductive layer 104c. In some embodiments, the photoresist PR may entirely cover the second conductive layer 104b and cover a portion of the first conductive layer 104a and a portion of the third conductive layer 104c.

In some embodiments, the photoresist PR may be patterned by a patterning process. In some embodiments, the patterning process may include a photolithography process and an etching process. The photolithography process may include, but is not limited to, photoresist coating (e.g., spin coating), soft baking, hard baking, mask alignment, exposure, post-exposure baking, photoresist development, cleaning, drying and so on. In some embodiments, the etching process described above may include, but is not limited to, a dry etching process or a wet etching process.

Figure 3F:
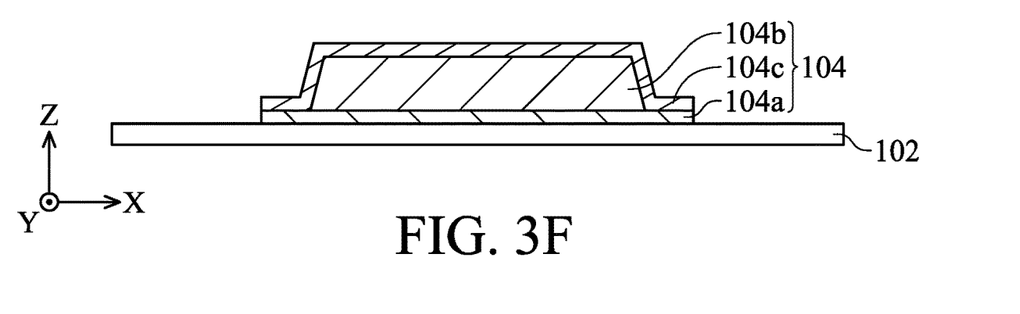

Next, referring to FIG. 3F, in some embodiments, a portion of the first conductive layer 104a and a portion of the third conductive layer 104c may be removed to form the patterned first conductive layer 104a and the patterned third conductive layer 104c. Specifically, the first conductive layer 104a and the third conductive layer 104c that are not shielded by the photoresist PR may be removed by an etching process. In this embodiment, the above etching process may be a dry etching process. However, in some other embodiments, a portion of the first conductive layer 104a and a portion of the third conductive layer 104c may also be removed by a wet etching process.

Furthermore, after the patterned first conductive layer 104a and the third conductive layer 104c are formed, the photoresist PR may be removed. In some embodiments, the photoresist PR may be removed by a wet stripping process, a plasma ashing process, or a combination thereof.

As shown in FIG. 3F, the method for manufacturing the multilayer electrode 104 is substantially completed here. As described above, in accordance with some embodiments, the multilayer electrode 104 may be formed by a two-step etching process (e.g., as shown in FIG. 3B and FIG. 3F). Moreover, in some embodiments, the first conductive layer 104a and the third conductive layer 104c may be formed by the same etching process (e.g., as shown in FIG. 3F).

Next, referring to FIGS. 4A-4F, which are cross-sectional diagrams of some components (for example, a multilayer electrode 104) of the electronic device 100 in the intermediate stages of manufacture in accordance with some other embodiments of the present disclosure.

Figure 4A:
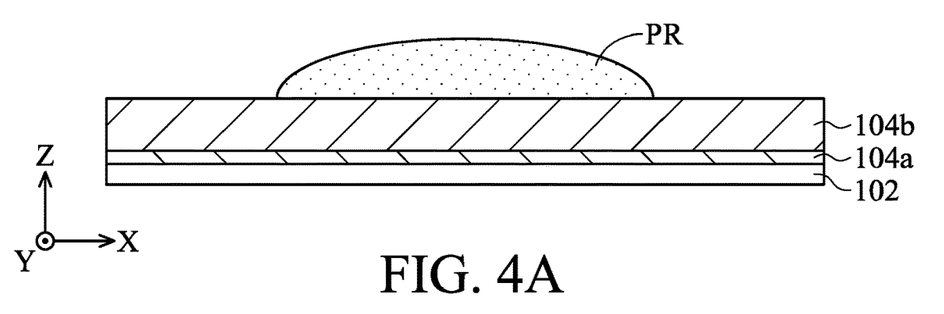
FIGS. 4A-4F are cross-sectional diagrams of the electronic device in the intermediate stages of manufacture in accordance with some embodiments of the present disclosure.

Referring to FIG. 4A, in some embodiments, the first substrate 102 may be provided, and the first conductive layer 104a and the second conductive layer 104b are sequentially formed on the first substrate 102. Next, a photoresist PR may be formed on the second conductive layer 104b to define a subsequent patterned shape of the second conductive layer 104b.

Figure 4B:
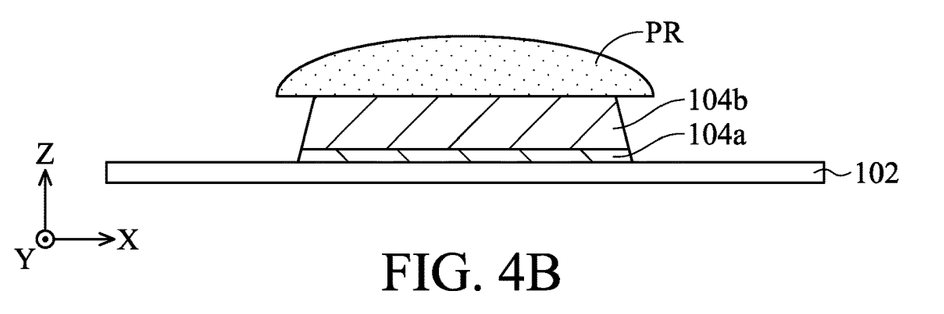

Next, referring to FIG. 4B, in some embodiments, a portion of the first conductive layer 104a and a portion of the second conductive layer 104b may be removed to form the patterned first conductive layer 104a and the patterned second conductive layer 104b. Specifically, the first conductive layer 104a and the second conductive layer 104b that are not shielded by the photoresist PR may be removed by an etching process. In this embodiment, the above etching process may be a wet etching process. However, in some other embodiments, a portion of the first conductive layer 104a and a portion of the second conductive layer 104b may also be removed by a dry etching process.

Figure 4C:
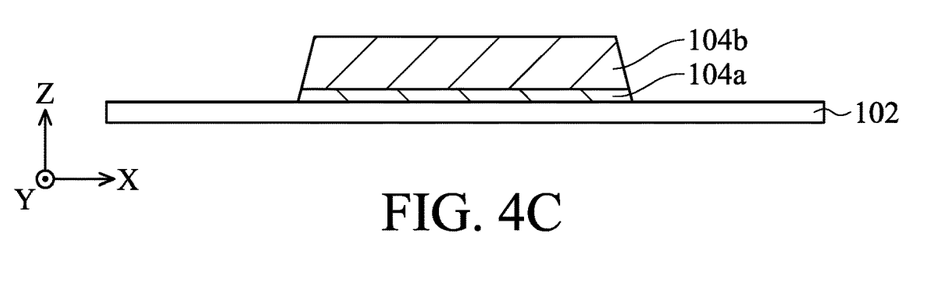

Next, referring to FIG. 4C, in some embodiments, after the patterned first conductive layer 104a and the patterned second conductive layer 104b are formed, the photoresist PR may be removed. In some embodiments, the photoresist PR may be removed by a wet stripping process, a plasma ashing process, or a combination thereof.

Figure 4D:
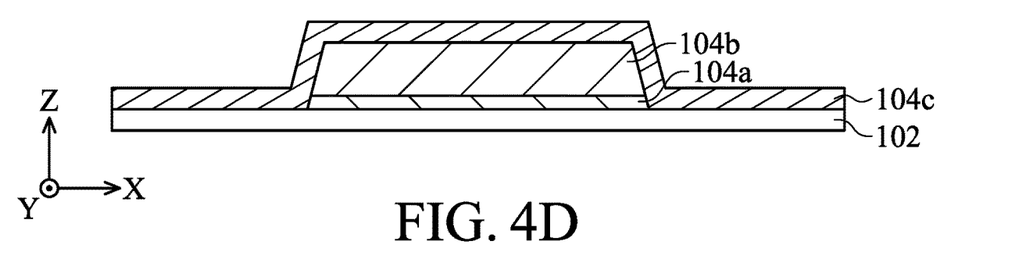

Next, referring to FIG. 4D, in some embodiments, the third conductive layer 104c may be formed on the first substrate 102. In some embodiments, the third conductive layer 104c may be conformally formed on the first conductive layer 104a and the second conductive layer 104b.

Figure 4E:
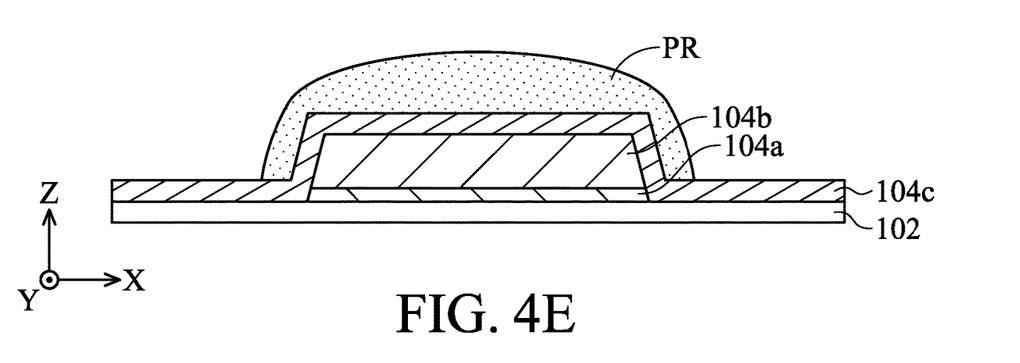

Next, referring to FIG. 4E, in some embodiments, a photoresist PR may be formed on the first substrate 102 to define a subsequent patterned shape of the third conductive layer 104c. In some embodiments, the photoresist PR may entirely cover the first conductive layer 104a and the second conductive layer 104b and cover a portion of the third conductive layer 104c.

Figure 4F:
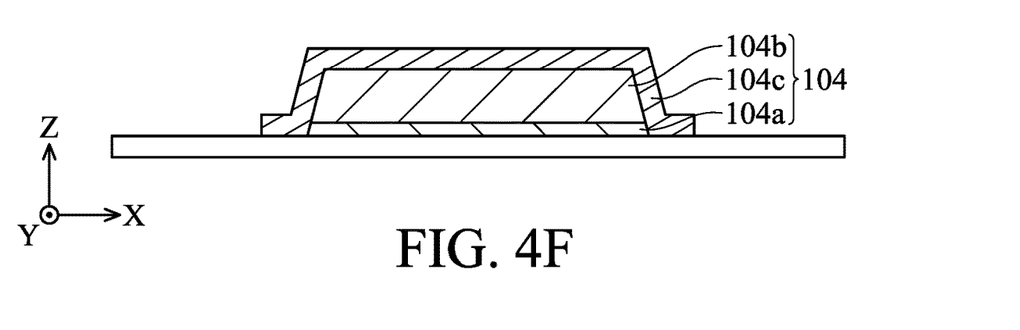

Next, referring to FIG. 4F, in some embodiments, a portion of the third conductive layer 104c may be removed to form a patterned third conductive layer 104c. Specifically, the third conductive layer 104c that is not shielded by the photoresist PR may be removed by an etching process. In this embodiment, the above etching process may be a dry etching process. However, in some other embodiments, a portion of the third conductive layer 104c may also be removed by a wet etching process.

Moreover, after the patterned third conductive layer 104c is formed, the photoresist PR may be removed. In some embodiments, the photoresist PR may be removed by a wet stripping process, a plasma ashing process, or a combination thereof.

As shown in FIG. 4F, the method for manufacturing the multilayer electrode 104 is substantially completed here. As described above, in accordance with some embodiments, the multilayer electrode 104 may be formed by a two-step etching process (e.g., as shown in FIG. 4B and FIG. 4F). Moreover, in some embodiments, the first conductive layer 104a and the second conductive layer 104b may be formed by the same etching process (e.g., as shown in FIG. 4B).

To summarize the above, in accordance with some embodiments of the present disclosure, the provided electronic device may include a multilayer electrode having a first conductive layer, a second conductive layer, and a third conductive layer. The third conductive layer may serve as a buffer layer that entirely covers the second conductive layer to protect the second conductive layer, or to improve adhesion between the passivation layer and the multilayer electrode, or to decrease the difference in their thermal expansion coefficients. Therefore, the risk of microcracks forming in the passivation layer and corrosion of the multilayer electrode may be reduced.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. In addition, the features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The scope of protection of present disclosure is subject to the definition of the scope of the appended claims.

What is claimed is:

1. An electronic device, comprising:
  a first substrate;
  an insulating layer overlapped with the first substrate;
  a first conductive layer; and
  a second conductive layer contacting with the first conductive layer, wherein the first conductive layer and the second conductive layer are disposed between the first substrate and the insulating layer, and the second conductive layer is disposed between the first conductive layer and the insulating layer,
  wherein a thermal expansion coefficient of the second conductive layer is between a thermal expansion coefficient of the first conductive layer and a thermal expansion coefficient of the insulating layer,
  wherein the insulating layer comprises a first curved top corner, a first top surface and a first side surface, and the first curved top corner is connected between the first top surface and the first side surface.

2. The electronic device as claimed in claim 1, wherein the second conductive layer comprises a second curved top corner.

3. The electronic device as claimed in claim 2, wherein the second conductive layer comprises a second top surface and a second side surface, and the second curved top corner is connected between the second top surface and the second side surface.

4. The electronic device as claimed in claim 1, wherein a thickness of the first conductive layer is different from a thickness of the second conductive layer.

5. The electronic device as claimed in claim 1, further comprising a third conductive layer, wherein the first conductive layer is disposed between the third conductive layer and the second conductive layer.

6. The electronic device as claimed in claim 5, wherein a thickness of the first conductive layer is greater than a thickness of the second conductive layer and a thickness of the third conductive layer.

7. The electronic device as claimed in claim 5, wherein a material of the second conductive layer is the same as a material of the third conductive layer.

8. The electronic device as claimed in claim 7, wherein the material of the second conductive layer and the third conductive layer comprises titanium (Ti), molybdenum (Mo), titanium alloy, molybdenum alloy, indium zinc oxide (IZO), indium tin oxide (ITO), or a combination thereof.

9. The electronic device as claimed in claim 1, wherein a material of the first conductive layer comprises copper (Cu), aluminum (Al), copper alloy, aluminum alloy, or a combination thereof.

10. The electronic device as claimed in claim 1, wherein the first conductive layer comprises a third curved top corner.

11. The electronic device as claimed in claim 1, wherein the thermal expansion coefficient of the second conductive layer is from 2 to 17.

12. The electronic device as claimed in claim 1, further comprising:
a second substrate disposed opposite to the first substrate, and
a working medium disposed between the first substrate and the second substrate.

13. An electronic device, comprising:
a first substrate;
an insulating layer overlapped with the first substrate;
a first conductive layer; and
a second conductive layer contacting with the first conductive layer, wherein the first conductive layer and the second conductive layer are disposed between the first substrate and the insulating layer, and the second conductive layer is disposed between the first conductive layer and the insulating layer,
wherein a thermal expansion coefficient of the second conductive layer is between a thermal expansion coefficient of the first conductive layer and a thermal expansion coefficient of the insulating layer,
wherein the first conductive layer comprises a first curved top corner.

* * * * *